United States Patent
Weichert et al.

(10) Patent No.: US 7,445,446 B2
(45) Date of Patent: Nov. 4, 2008

(54) METHOD FOR IN-LINE MONITORING AND CONTROLLING IN HEAT-TREATING OF RESIST COATED WAFERS

(75) Inventors: Heiko Weichert, Utzberg (DE); Kirsten Ruck, Dresden (DE)

(73) Assignee: Tokyo Electron Limited, Tokyo (JP)

( * ) Notice: Subject to any disclaimer, the term of this patent is extended or adjusted under 35 U.S.C. 154(b) by 10 days.

(21) Appl. No.: 11/536,978

(22) Filed: Sep. 29, 2006

(65) Prior Publication Data
US 2008/0102412 A1 May 1, 2008

(51) Int. Cl.
*H05B 3/68* (2006.01)
(52) U.S. Cl. .................. 432/247; 219/448.11; 430/330; 356/237.2
(58) Field of Classification Search ................. 432/239; 219/448.11
See application file for complete search history.

(56) References Cited

U.S. PATENT DOCUMENTS

| | | | | |
|---|---|---|---|---|
| 6,644,965 B2 * | 11/2003 | Ookura et al. | ............... | 432/253 |
| 6,689,519 B2 * | 2/2004 | Brown et al. | ................... | 430/30 |
| 6,806,008 B2 * | 10/2004 | Schedel et al. | ................ | 430/30 |
| 6,891,627 B1 * | 5/2005 | Levy et al. | .................. | 356/625 |
| 6,969,829 B2 * | 11/2005 | Tsuruno et al. | ............. | 219/390 |
| 6,987,572 B2 * | 1/2006 | Lakkapragada et al. | .. | 356/237.5 |
| 7,101,816 B2 | 9/2006 | Kaushal et al. | | |
| 7,106,433 B2 * | 9/2006 | Hasan | ...................... | 356/237.4 |
| 7,187,796 B1 * | 3/2007 | Phan et al. | .................. | 382/144 |
| 7,227,628 B1 * | 6/2007 | Sullivan et al. | .......... | 356/237.4 |
| 2002/0177094 A1 * | 11/2002 | Shirakawa | ................... | 432/253 |
| 2002/0177245 A1 * | 11/2002 | Sonderman et al. | ........... | 438/14 |
| 2003/0015493 A1 * | 1/2003 | Grasshoff et al. | ............. | 216/59 |
| 2003/0186183 A1 * | 10/2003 | Ito et al. | ...................... | 432/253 |
| 2004/0241561 A1 * | 12/2004 | Chen et al. | .................... | 430/30 |
| 2006/0024850 A1 * | 2/2006 | Monahan et al. | .............. | 438/14 |
| 2006/0094131 A1 * | 5/2006 | Wang et al. | ................. | 356/625 |
| 2006/0222975 A1 * | 10/2006 | Ke et al. | ....................... | 430/30 |
| 2006/0252000 A1 * | 11/2006 | Hayashi et al. | ............. | 432/253 |
| 2007/0068453 A1 * | 3/2007 | Chen et al. | .................. | 118/668 |

* cited by examiner

Primary Examiner—Gregory A Wilson
(74) Attorney, Agent, or Firm—Wood, Herron & Evans, LLP

(57) ABSTRACT

A method of heat-treating resist coated manufacturing wafers in a processing system by establishing a temperature profile for each of a plurality of hotplates in the processing system, heat-treating the resist coated manufacturing wafers on the hotplates, obtaining CD metrology data from test areas on the heat-treated resist coated manufacturing wafers, determining CD variations for each hotplate from the CD metrology data, adjusting the temperature profile of one or more hotplates after determining the CD variations, and heat-treating additional resist coated manufacturing wafers on the hotplates after the adjusting.

17 Claims, 10 Drawing Sheets

METHOD FOR IN-LINE MONITORING AND CONTROLLING IN HEAT-TREATING OF RESIST COATED WAFERS

CROSS-REFERENCE TO RELATED APPLICATIONS

This application is related to co-pending U.S. patent application Ser. Nos. 11/536,991 and 11/536,085, both entitled "METHOD OF REAL TIME DYNAMIC CD CONTROL," filed on even date herewith, the entire contents of which are hereby incorporated by reference.

FIELD OF THE INVENTION

The invention relates to a method for processing wafers, and more particularly, to a method of in-line monitoring and controlling in heat-treating of resist coated manufacturing wafers.

BACKGROUND OF THE INVENTION

In a photolithography process for manufacturing semiconductor devices and liquid crystal displays (LCD's), resist is coated on a substrate, and the resultant photoresist coating film is exposed to light and developed. The series of processing stages are carried out in a coating/developing processing system having discrete heating sections, where each heating section incorporates a hotplate with a built-in heater of a resistance heating type.

Feature sizes of semiconductor device circuits have been reduced to less than 0.1 microns. Typically, the pattern wiring that interconnects individual device circuits is formed with sub-micron line widths. To provide reproducible and accurate feature sizes and line widths, it is strongly desired to control more accurately the heat-treatment temperature of the photoresist film. The substrates or wafers are usually treated or processed using the same process recipe (i.e., individual treatment program) in units (i.e., lots or batches) each consisting of, for example, twenty-five wafers. Individual process recipes define heat-treatment conditions under which the heat-treating is performed. Wafers belonging to the same lot are usually heated under the same conditions.

Post exposure bake (PEB) plays an important role in photoresist processing. Heat-treating a photoresist may have many purposes, from removing a solvent from the photoresist to catalyzing chemical amplification in the photoresist. In addition to the intended results, heat-treating may cause numerous problems. For example, the light sensitive component of the photoresist may decompose at temperatures typically used to remove the solvent, which is an extremely serious concern for a chemically amplified resist (CAR) since the remaining solvent content has a strong impact on the diffusion and amplification rates. In addition, heat-treating can affect the dissolution properties of the resist and thus have direct influence on the developed resist profile. CAR's are particularly sensitive to temperature variations during heat-treatment and temperature variations can result in variations in critical dimensions (CDs) across a wafer surface.

Often, temperature variations in heat-treating processes such as PEB are monitored and corrected by heat-treating resist coated test wafers (non-manufacturing wafers) on a regular basis, measuring CDs of the resulting structures formed on the test wafers, and adjusting the temperature of the hotplate. The use of non-production test wafers has important disadvantages that include manufacturing down time, limited information and test accuracy acquired from the test wafers due to few test wafer runs and therefore small amount of data, and short-term temperature deviations that may go unnoticed due to long intervals between test wafer runs. Similarly, test wafers that contain temperature sensors (e.g., thermocouples) can only be run infrequently and subsequently any temperature adjustments made using the temperature sensor data must be confirmed by measuring CDs on processed test wafers.

Therefore, new methods are required for monitoring and controlling heat-treating of resist coated wafers that can provide the high metrology data density required for optimizing a heat-treating process, while allowing for high wafer throughput.

SUMMARY OF THE INVENTION

Embodiments of the invention provide a method for in-line monitoring and controlling in heat-treating of resist coated manufacturing wafers. The method provides the high metrology data density required for optimizing a heat-treating process with small confidence intervals while allowing for high wafer throughput.

According to one embodiment of the invention, the method includes establishing a temperature profile for each of a plurality of hotplates in a processing system, heat-treating the resist coated manufacturing wafers on the hotplates, obtaining CD metrology data from test areas on the heat-treated manufacturing wafers, determining CD variations for each hotplate from the CD metrology data, adjusting the temperature profile of one or more hotplates after determining the CD variations, and heat-treating additional resist coated manufacturing wafers on the hotplates after the adjusting.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Embodiments of the invention provide a method for in-line monitoring and controlling in heat-treating of resist coated manufacturing wafers on a plurality of hotplates in a processing system. The method provides the high metrology data density required for controlling and optimizing a heat-treating process with a small confidence interval while allowing for high wafer throughput. Small temperature differences between hotplates used for the heat-treating using the same heat-treating recipe can be monitored and analyzed by comparing CD metrology data obtained from each hotplate. The CD metrology data can be processed by a mathematical model to adjust the temperature of one or more hotplates. When compared to current methods of monitoring and controlling using test wafers, embodiments of the current invention monitor resist coated manufacturing wafers to provide greatly improved temperature adjustment capabilities and increased wafer throughput. As used herein, "test wafers" refer to non-manufacturing wafers, i.e., wafers that are only used for periodic testing of manufacturing processes but do not become semiconductor devices. Generally, test wafers are resist-coated Si wafers that do not contain any of the multiple material layers that manufacturing wafers contain.

The terms "wafer" and "substrate" are used interchangeably herein to refer to a thin slice of material, such as a silicon crystal or glass material, upon which microcircuits are constructed, for example by diffusion, deposition, and etching of various materials.

Figure 1:
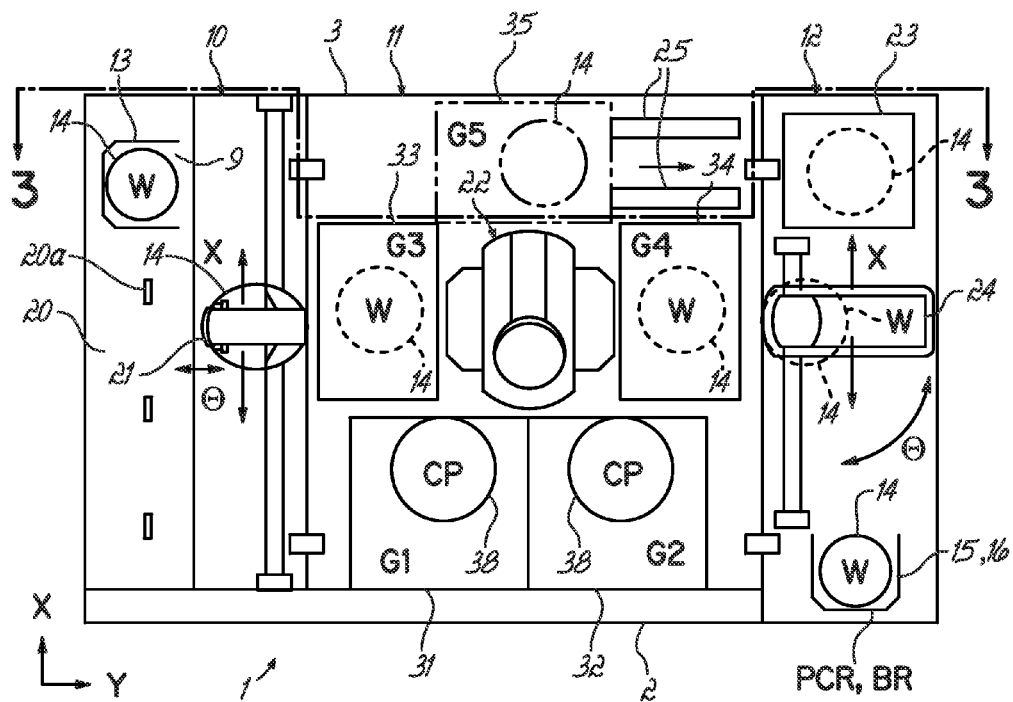
FIG. 1 is a top view of a schematic diagram of a coating/developing system for use in accordance with embodiments of the invention.
Figure 2:
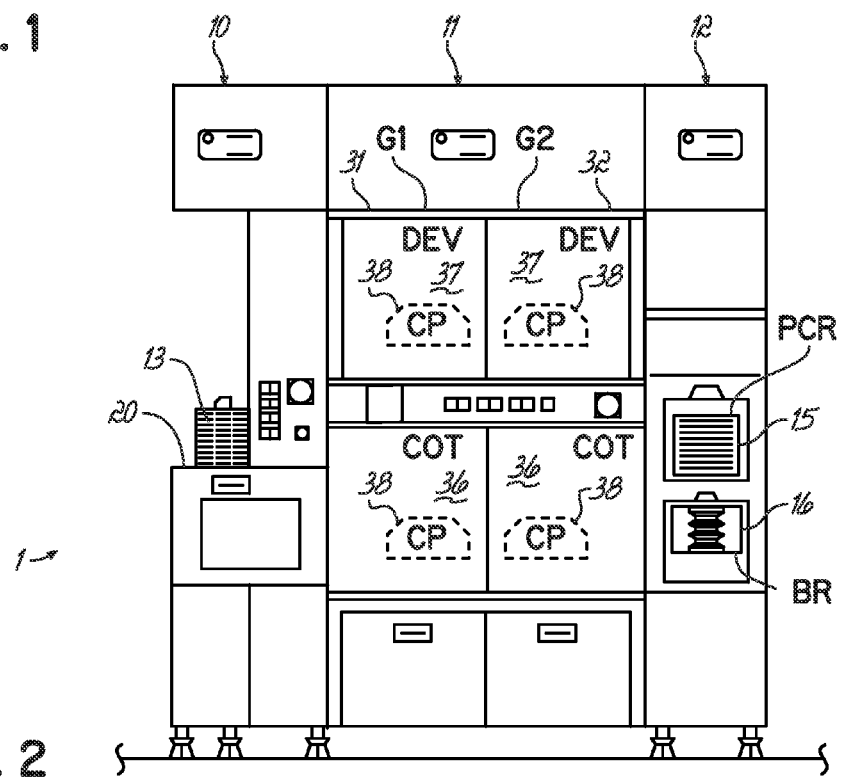
FIG. 2 is a front view of the coating/developing system of FIG. 1.
Figure 3:
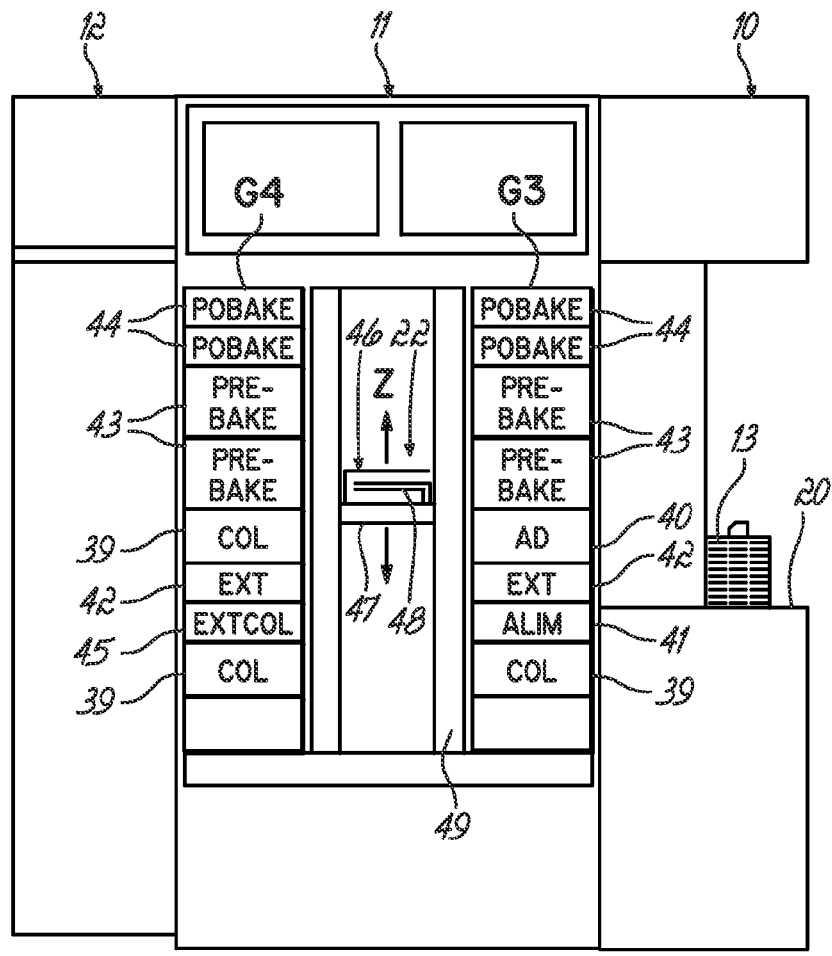
FIG. 3 is a partially cut-away back view of the coating/developing system of FIG. 1, as taken along line 3-3.

With reference to FIGS. 1-3, a coating/developing processing system 1 has a load/unload section 10, a process section 11, and an interface section 12. The load/unload section 10 has a cassette table 20 on which cassettes (CR) 13, each storing a plurality of semiconductor wafers (W) 14 (e.g., 25), are loaded and unloaded from the processing system 1. The process section 11 has various single wafer processing units for processing wafers 14 sequentially one by one. These processing units are arranged in predetermined positions of multiple stages, for example, within first (G1), second (G2), third (G3), fourth (G4) and fifth (G5) multiple-stage process unit groups 31, 32, 33, 34, 35. The interface section 12 is interposed between the process section 11 and one or more light exposure systems (not shown), and is configured to transfer resist coated wafers between the process section. The one or more light exposure systems can include a resist patterning system such as a photolithography tool that transfers the image of a circuit or a component from a mask onto a resist on the wafer surface.

The coating/developing processing system 1 also includes a CD metrology system for obtaining CD metrology data from test areas on the patterned wafers. The CD metrology system may be located within the processing system 1, for example at one of the multiple-stage process unit groups 31, 32, 33, 34, 35. The CD metrology system can be a light scattering system, such as an optical digital profilometry (ODP) system.

The ODP system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035). ODP software is available from Timbre Technologies Inc. (2953 Bunker Hill Lane, Santa Clara, Calif. 95054).

When performing optical metrology, such as scatterometry, a structure on a substrate, such as a semiconductor wafer or flat panel, is illuminated with electromagnetic (EM) radiation, and a diffracted signal received from the structure is utilized to reconstruct the profile of the structure. The structure may include a periodic structure, or a non-periodic structure. Additionally, the structure may include an operating structure on the substrate (i.e., a via or contact hole, or an interconnect line or trench, or a feature formed in a mask layer associated therewith), or the structure may include a periodic grating or non-periodic grating formed proximate to an operating structure formed on a substrate. For example, the periodic grating can be formed adjacent a transistor formed on the substrate. Alternatively, the periodic grating can be formed in an area of the transistor that does not interfere with the operation of the transistor. The profile of the periodic grating is obtained to determine whether the periodic grating, and by extension the operating structure adjacent the periodic grating, has been fabricated according to specifications.

Still referring to FIGS. 1-3, a plurality of projections 20a are formed on the cassette table 20. A plurality of cassettes 13 are each oriented relative to the process section 11 by these projections 20a. Each of the cassettes 13 mounted on the cassette table 20 has a load/unload opening 9 facing the process section 11.

The load/unload section 10 includes a first sub-arm mechanism 21 that is responsible for loading/unloading the wafer W into/from each cassette 13. The first sub-arm mechanism 21 has a holder portion for holding the wafer 14, a back and forth moving mechanism (not shown) for moving the holder portion back and forth, an X-axis moving mechanism (not shown) for moving the holder portion in an X-axis direction, a Z-axis moving mechanism (not shown) for moving the holder portion in a Z-axis direction, and a θ (theta) rotation mechanism (not shown) for rotating the holder portion around the Z-axis. The first sub-arm mechanism 21 can gain access to an alignment unit (ALIM) 41 and an extension unit (EXT) 42 belonging to a third (G3) process unit group 33, as further described below.

With specific reference to FIG. 3, a main arm mechanism 22 is liftably arranged at the center of the process section 11. The process units G1-G5 are arranged around the main arm mechanism 22. The main arm mechanism 22 is arranged within a cylindrical supporting body 49 and has a liftable wafer transporting system 46. The cylindrical supporting body 49 is connected to a driving shaft of a motor (not shown). The driving shaft may be rotated about the Z-axis in synchronism with the wafer transporting system 46 by an angle of θ. The wafer transporting system 46 has a plurality of holder portions 48 movable in a front and rear direction of a transfer base table 47.

Units belonging to first (G1) and second (G2) process unit groups 31, 32, are arranged at the front portion 2 of the coating/developing processing system 1. Units belonging to the third (G3) process unit group 33 are arranged next to the load/unload section 10. Units belonging to a fourth (G4)

process unit group 34 are arranged next to the interface section 12. Units belonging to a fifth (G5) process unit group 35 are arranged in a back portion 3 of the processing system 1.

With reference to FIG. 2, the first (G1) process unit group 31 has two spinner-type process units for applying a predetermined treatment to the wafer 14 mounted on a spin chuck (not shown) within the cup (CP) 38. In the first (G1) process unit group 31, for example, a resist coating unit (COT) 36 and a developing unit (DEV) 37 are stacked in two stages sequentially from the bottom. In the second (G2) process unit group 32, two spinner type process units such as a resist coating unit (COT) 36 and a developing unit (DEV) 37, are stacked in two stages sequentially from the bottom. In an exemplary embodiment, the resist coating unit (COT) 36 is set at a lower stage than the developing unit (DEV) 37 because a discharge line (not shown) for the resist waste solution is desired to be shorter than a developing waste solution for the reason that the resist waste solution is more difficult to discharge than the developing waste solution. However, if necessary, the resist coating unit (COT) 36 may be arranged at an upper stage relative to the developing unit (DEV) 37.

With reference to FIG. 3, the third (G3) process unit group 33 has a cooling unit (COL) 39, an alignment unit (ALIM) 41, an adhesion unit (AD) 40, an extension unit (EXT) 42, two prebaking units (PREBAKE) 43, and two postbaking units (POBAKE) 44, which are stacked sequentially from the bottom.

Similarly, the fourth (G4) process unit group 34 has a cooling unit (COL) 39, an extension-cooling unit (EXTCOL) 45, an extension unit (EXT) 42, another cooling unit (COL) 39, two prebaking units (PREBAKE) 43 and two postbaking units (POBAKE) 44 stacked sequentially from the bottom. Although only two prebaking units 43 and only two postbaking units 44 are shown, G3 and G4 may contain any number of prebaking units 43 and postbaking units 44. Furthermore, any or all of the prebaking units 43 and postbaking units 44 may be configured to perform PEB, post application bake (PAB), and post developing bake (PDB) processes.

In an exemplary embodiment, the cooling unit (COL) 39 and the extension cooling unit (EXTCOL) 45, to be operated at low processing temperatures, are arranged at lower stages, and the prebaking unit (PREBAKE) 43, the postbaking unit (POBAKE) 44 and the adhesion unit (AD) 40, to be operated at high temperatures, are arranged at the upper stages. With this arrangement, thermal interference between units may be reduced. Alternatively, these units may have different arrangements.

At the front side of the interface section 12, a movable pick-up cassette (PCR) 15 and a non-movable buffer cassette (BR) 16 are arranged in two stages. At the backside of the interface section 12, a peripheral light exposure system 23 is arranged. The peripheral light exposure system 23 can contain a lithography tool. Alternately, the lithography tool and the ODP system may be remote to and cooperatively coupled to the coating/developing processing system 1. At the center portion of the interface section 12, a second sub-arm mechanism 24 is provided, which is movable independently in the X and Z directions, and which is capable of gaining access to both cassettes (PCR) 15 and (BR) 16 and the peripheral light exposure system 23. In addition, the second sub-arm mechanism 24 is rotatable around the Z-axis by an angle of θ and is designed to be able to gain access not only to the extension unit (EXT) 42 located in the fourth (G4) processing unit 34 but also to a wafer transfer table (not shown) near a remote light exposure system (not shown).

In the processing system 1, the fifth (G5) processing unit group 35 may be arranged at the back portion 3 of the backside of the main arm mechanism 22. The fifth (G5) processing unit group 35 may be slidably shifted in the Y-axis direction along a guide rail 25. Since the fifth (G5) processing unit group 35 may be shifted as mentioned, maintenance operation may be applied to the main arm mechanism 22 easily from the backside.

Figure 4:
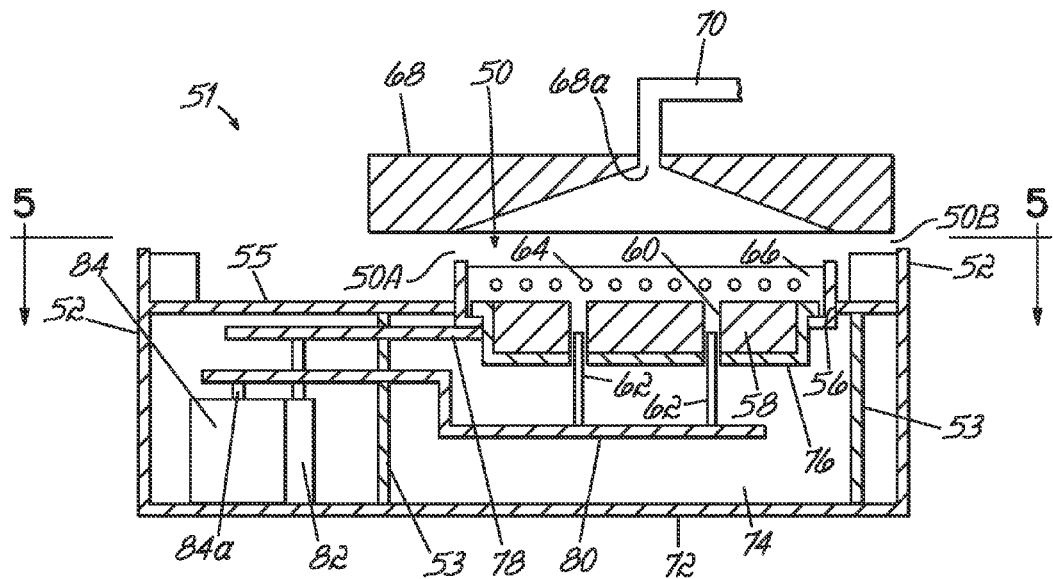
FIG. 4 is a cross-sectional view of a single heat-treatment system of FIG. 3.
Figure 5:
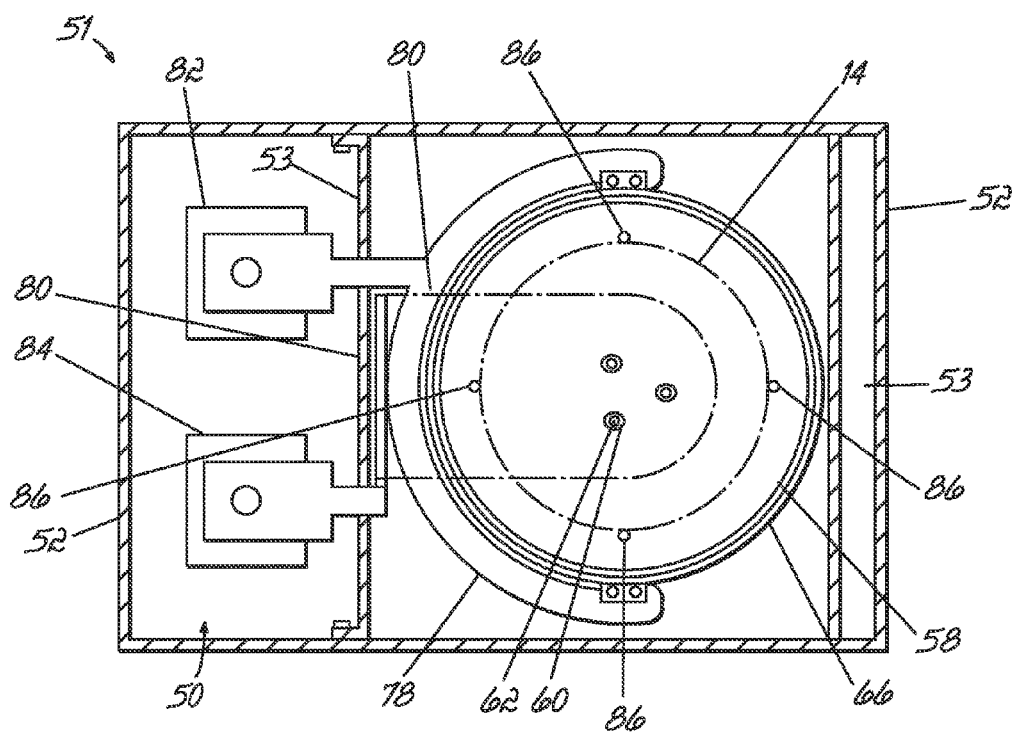
FIG. 5 is a plan view of the heat-treatment system of FIG. 4, as viewed from line 5-5.

The prebaking unit (PREBAKE) 43, the postbaking unit (POBAKE) 44, and the adhesion unit (AD) 40 each comprise a heat-treatment system in which wafers 14 are heated to temperatures above room temperature. With reference to FIGS. 4 and 5, each heat-treatment system 51 includes a processing chamber 50, a hotplate 58, and a resistance heater (not shown) embedded in the hotplate 58.

The hotplate 58 has a plurality of through-holes 60 and a plurality of lift pins 62 inserted into the through-holes 60. The lift pins 62 are connected to and supported by an arm 80, which is further connected to and supported by a rod 84a of a liftable vertical cylinder 84. When the rod 84a is actuated to protrude from the vertical cylinder 84, the lift pins 62 protrude from the hotplate 58, thereby lifting the wafer 14.

With continued reference to FIGS. 4 and 5, the processing chamber 50 is defined by a sidewall 52, a horizontal shielding plate 55, and a cover 68. Openings 50A, 50B are formed at a front surface side (aisle side of the main arm mechanism 22) and a rear surface side of the processing chamber 50, respectively. The wafer 14 is loaded into and unloaded from the processing chamber 50 through the openings 50A, 50B. A circular opening 56 is formed at the center of the horizontal shielding plate 55. The hotplate 58 is housed in the opening 56. The hotplate 58 is supported by the horizontal shielding plate 55 with the aid of a supporting plate 76.

A ring-form shutter 66 is attached to the outer periphery of the hotplate 58. Air holes 64 are formed along the periphery of the shutter 66 at intervals of central angles of two degrees. The air holes 64 communicate with a cooling gas supply source (not shown).

The shutter 66 is liftably supported by a cylinder 82 via a shutter arm 78. The shutter 66 is positioned at a place lower than the hotplate 58 at non-operation time, whereas, at an operation time, shutter 66 is lifted up to a position higher than the hotplate 58 and between the hotplate 58 and the cover 68. When the shutter 66 is lifted up, a cooling gas, such as nitrogen gas or air, is exhausted from the air holes 64.

With reference to FIG. 4, an exhaust port 68a at the center of the cover 68 communicates with an exhaust pipe 70. Gas generated from the surface of the wafer 14 at the heat-treatment detected temperature time is exhausted through the exhaust port 68a and vented from the processing chamber 50 via exhaust pipe 70 to an evacuation unit (not shown).

With reference to FIGS. 4 and 5, a compartment 74 is defined by the horizontal shielding plate 55, two sidewalls 53, and a bottom plate 72 formed below the horizontal shielding plate 55. Hotplate supporting plate 76, shutter arm 78, lift pin arm 80, and liftable cylinders 82, 84 are arranged in the compartment 74.

With reference to FIG. 5, a plurality of projections 86 are formed on an upper surface of the hotplate 58 for accurately positioning the wafer 14. In addition, a plurality of smaller projections (not shown) is formed on the upper surface of the hotplate 58. When the wafer 14 is mounted on the hotplate 58, top portions of these smaller projections contact the wafer 14, which produces a small gap between the wafer 14 and the hotplate 58 that prevents the lower surface of the wafer 14 from being strained and damaged.

Figure 6:
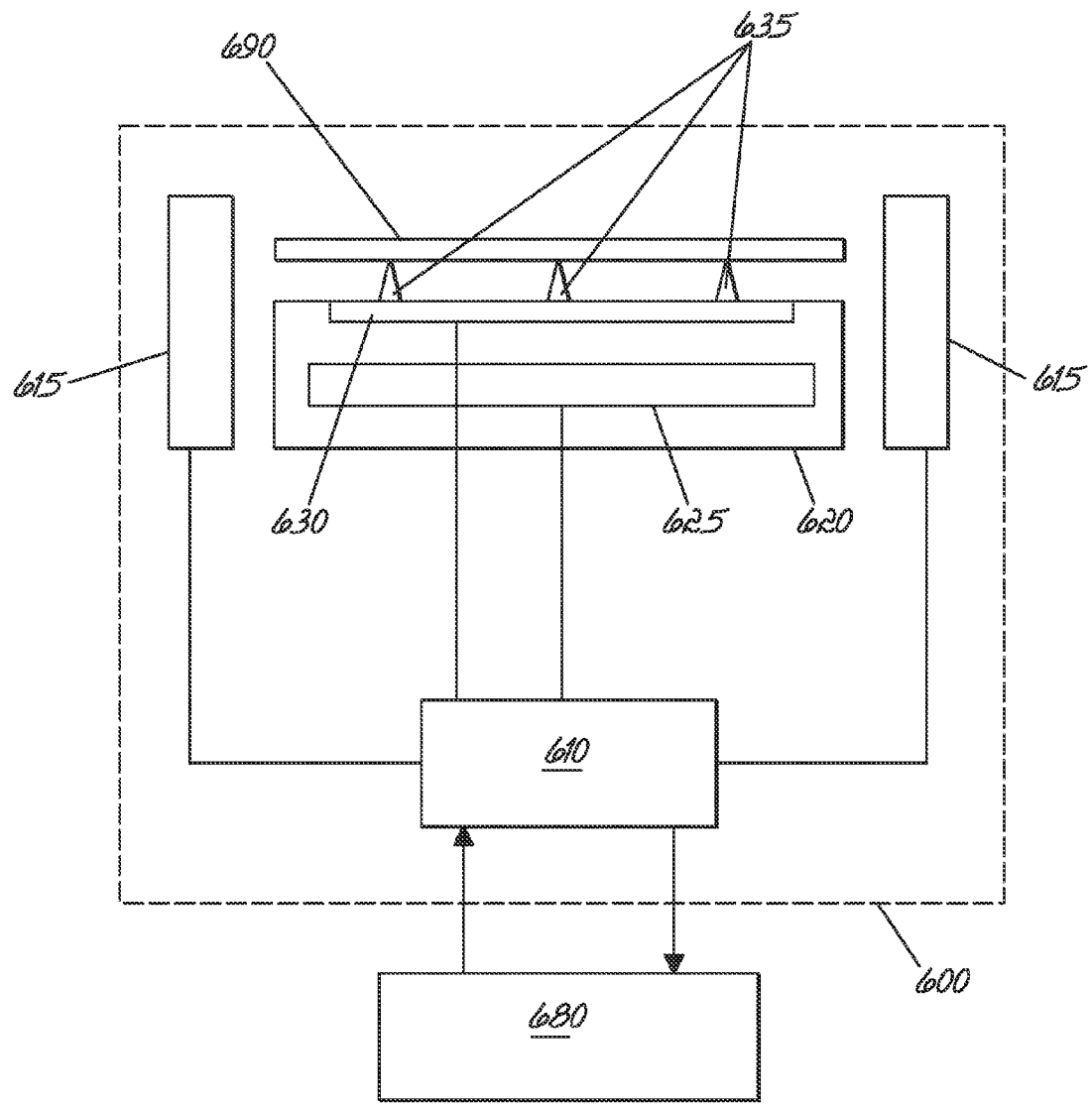
FIG. 6 is a diagrammatic view of a hotplate of a heat-treatment system in accordance with an embodiment of the invention.

With reference to FIG. 6, a heat-treatment system 600 in accordance with an embodiment of the invention includes a controller 610, a ventilation system 615, and a hotplate 620.

Hotplate 620 includes a heater 625, a sensor 630, and wafer support pins 635. A wafer 690 may be positioned on hotplate 620 using wafer support pins 635.

Hotplate 620 may have a circular shape and may comprise a number of segments (not shown). In addition, heater 625 may comprise a number of heating elements (not shown). For example, a heating element may be positioned within each segment of the hotplate 620. In an alternate embodiment, hotplate 620 may incorporate a cooling element and/or a combined heating/cooling element rather than a heating element.

Hotplate 620 may include a sensor 630, which may be a physical sensor and/or a virtual sensor. For example, sensor 630 may be a temperature sensor located within each hotplate segment. In addition, sensor 630 may include at least one pressure sensor. Controller 610 may be coupled to heater 625 and sensor 630. Various types of physical temperature sensors 630 may be used. For example, the sensors 630 can include a thermocouple, a temperature-indicating resistor, a radiation type temperature sensor, and the like. Other physical sensors 630 include contact-type sensors and non-contact sensors.

Heat-treatment system 600 may be coupled to a processing system controller 680 capable of providing data for an incoming wafer to heat-treatment system 600. The data can include wafer information, layer information, process information, and metrology information. Wafer information can include composition data, size data, thickness data, and temperature data. Layer information can include the number of layers, the composition of the layers, and the thickness of the layers. Process information can include data concerning previous steps and the current step. Metrology information can include optical digital profile data, such as critical dimension (CD) data, profile data, and uniformity data, and optical data, such as refractive index (n) data and extinction coefficient (k) data. For example, CD data and profile data can include information for features and open areas in one or more layers, and can also include uniformity data.

Figure 13:
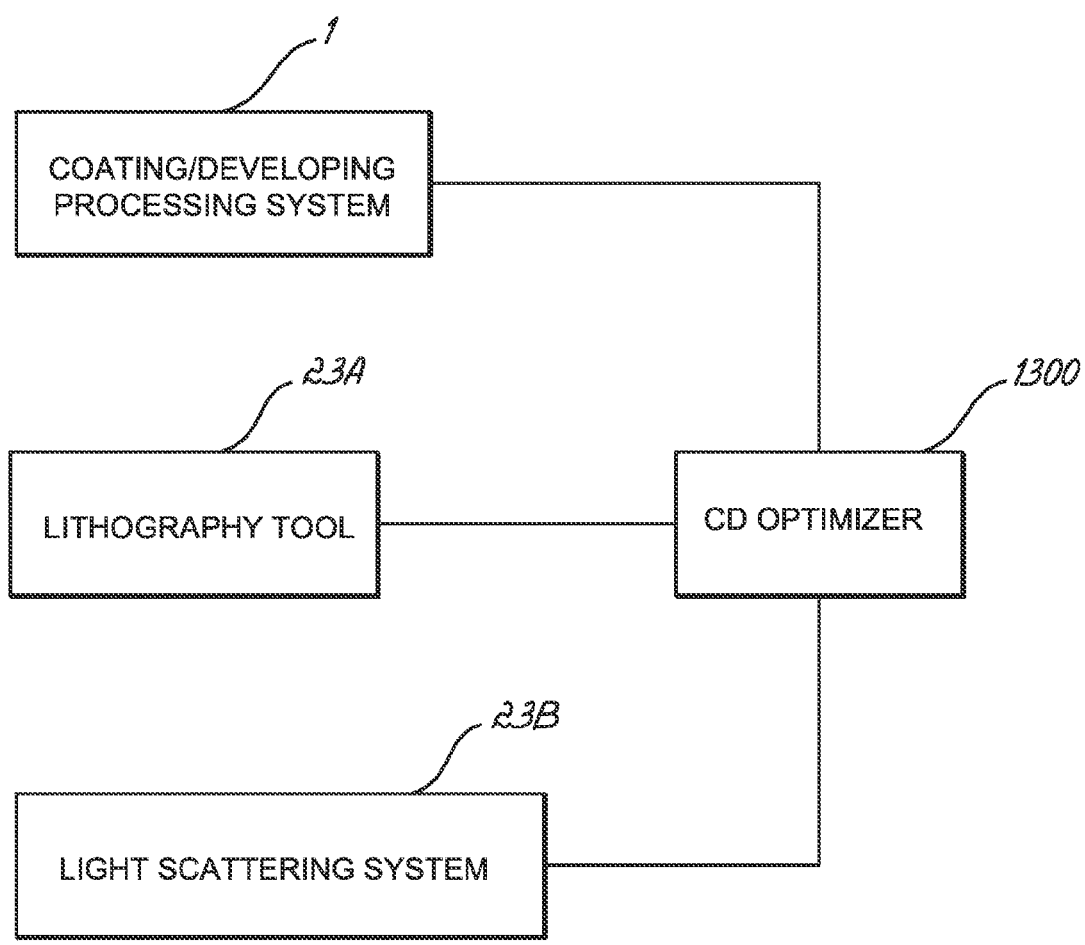
FIG. 13 schematically shows a CD optimizer system coupled to a coating/developing processing system, a lithography tool, and a light scattering system according to an embodiment of the invention.

Controller 610 may control the temperature of each of the plurality of hotplate segments (temperature control zones) to establish a temperature profile for the hotplate surface. The controller 610 may receive instructions from a CD optimizer system 1300 depicted in FIG. 13 to adjust the temperature of the plurality of hotplate segments based on CD metrology data received from heat-treated wafers. The CD optimizer system 1300 may be contained in the processing system controller 680 or the CD optimizer system 1300 may be contained in the controller 610. Adjusting the temperature of the plurality of hotplate segments establishes an adjusted temperature profile for the hotplate surface for heat-treating additional resist coated manufacturing wafers.

Controller 610 may comprise a microprocessor, a memory (e.g., volatile and/or non-volatile memory), and a digital I/O port. A program stored in the memory may be utilized to control the aforementioned components of a heat-treatment system according to a process recipe. Controller 610 may be configured to analyze the process data, to compare the process data with target process data, and to use the comparison to change a process and/or control the processing system components.

A ventilation system 615 is provided around the hotplate 620. Air or nitrogen gas may be provided to one or more surfaces of the hotplate 620 by ventilation system 615. For example, a shutter 66 and air holes 64 (FIG. 5) may be used. The ventilation system 615 can communicate with a gas supply source (not shown) at the upstream. Controller 610 can control the flow rate of gas flowing from the ventilation system 615. In an alternate embodiment, heat-treatment system 600 may include a monitoring device (not shown) that, for example, permits optical monitoring of the wafer.

Figure 7A:
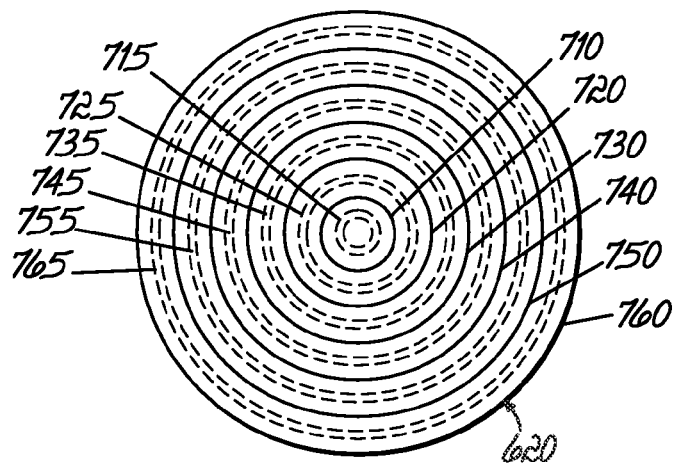
FIGS. 7A and 7B are diagrammatic views of hotplates in accordance with embodiments of the invention.
Figure 7B:
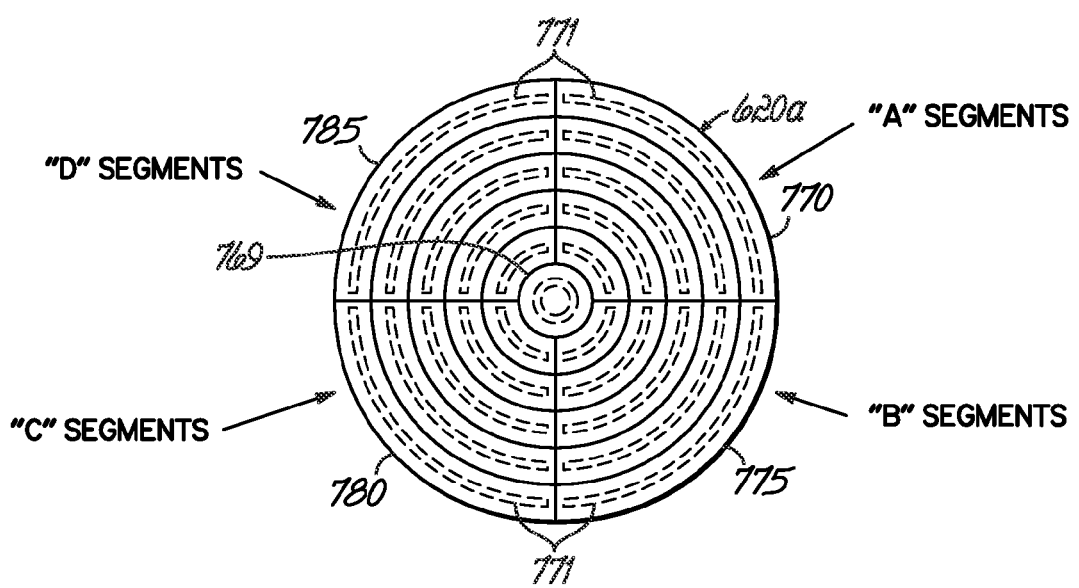

FIGS. 7A and 7B show exemplary schematic views of hotplates in accordance with an embodiment of the invention. In FIG. 7A, a circular hotplate 620 has a circular segment 710 and a plurality of annular ring segments 720, 730, 740, 750, and 760. Hotplate 620 may include any number of segments, which may have any suitable geometrical arrangement and/or dimensions. For example, the annular ring segments may have different radial dimensions relative to the hotplate centerline. In the illustrated embodiment, each segment 710, 720, 730, 740, 750, and 760 includes a corresponding one of a plurality of heating elements 715, 725, 735, 745, 755, and 765, each of which may be independently controlled.

With reference to FIG. 7B, a circular hotplate 620a has a circular central segment 769 and a plurality of sectors 770, 775, 780, 785. Equal radial dimension segments A, B, C, D are shown in FIG. 7B, but this is not required for the invention. Hotplate 620a may include any number of sectors and segments, which may have any suitable geometrical arrangement and/or dimensions. In the illustrated embodiment, individual segments A, B, C and D in sectors 770, 775, 780, 785 and central segment 769 each include at least one of a plurality of heating elements 771 that may each be independently controlled.

Figure 8:
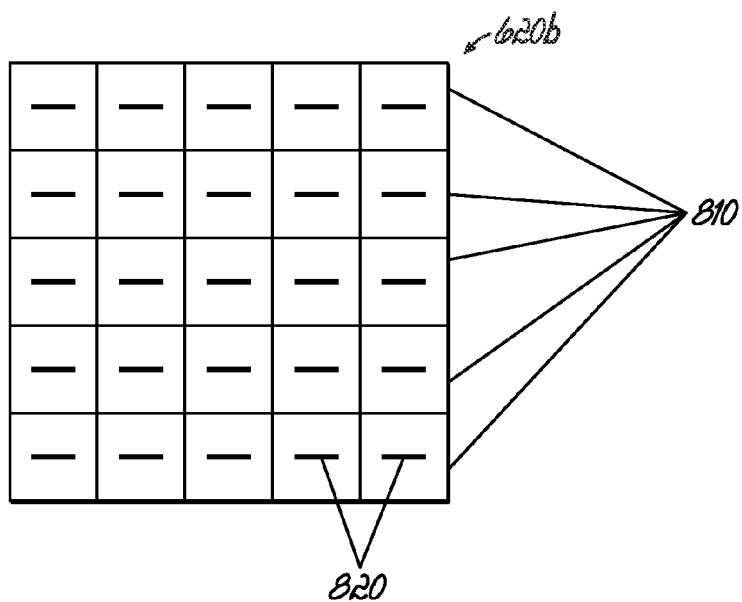
FIG. 8 is a diagrammatic view of a hotplate in accordance with an alternative embodiment of the invention.

FIG. 8 shows a schematic view of another hotplate 620b, in accordance with an embodiment of the invention, having a plurality of, for example, twenty-five square segments 810. Hotplate 620b may comprise a different number of segments 810, and the segments 810 may be shaped differently. For example, rectangular shapes may be used. In the illustrated embodiment, each segment 810 of the hotplate 620b includes a heating element 820, and each heating element 820 may be independently controlled.

Alternately, any of hotplates 620 and 620a-b may be constructed in the jacket form having at least one hollow and at least one recess. The wafer 690 (FIG. 6) may be heated by circulating a heat medium to the recesses, such as by inserting a heater or a heat pipe (not shown) into one or more recesses containing a liquid (heat medium). Alternatively, the hotplate may be heated to a predetermined heat-treatment temperature by allowing at least one hollow to be filled with vapor generated from a heat medium by application of heat thereto at one or more of the recesses.

Figure 9:
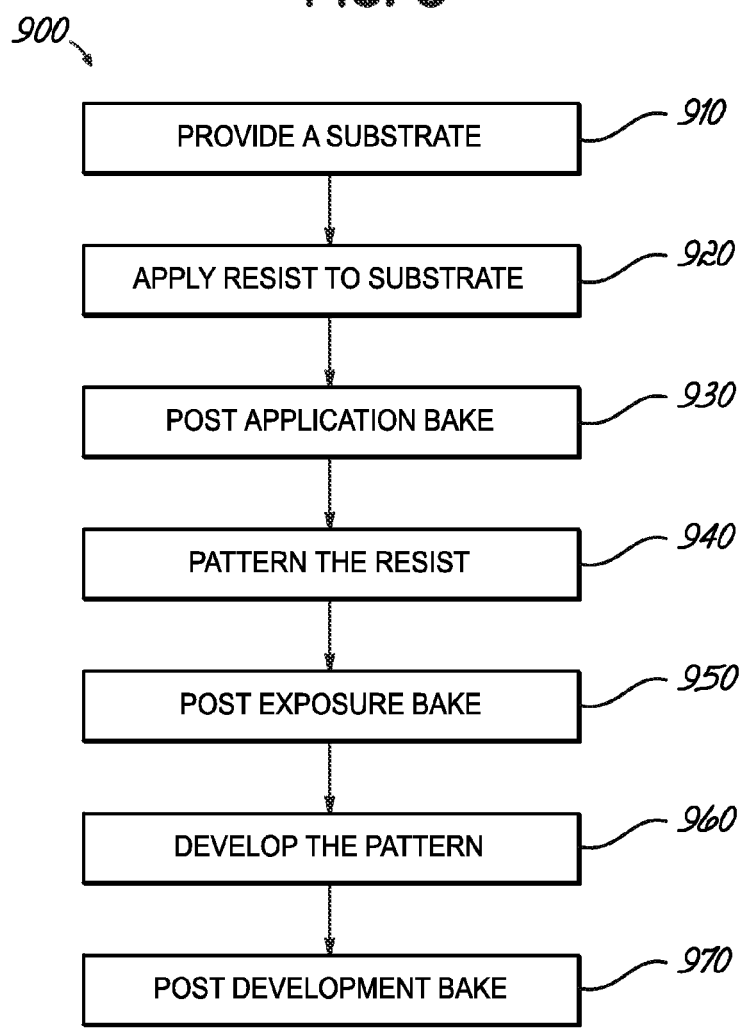
FIG. 9 is a simplified process flow diagram for a method of patterning a resist coated manufacturing wafer according to an embodiment of the invention.

FIG. 9 is a simplified process flow diagram for a method of patterning a resist coated manufacturing wafer according to embodiments of the invention. The patterning process produces a pattern that covers portions of the wafer with a resist. For example, during a photolithography process, complex circuit patterns are imaged onto the photosensitive resist material by a lithography tool to provide a physical barrier during further processing of the wafer to form semiconductor devices. During the further processing, the lithographic pattern can be transferred into the underlying wafer or wafer layers by an etching process (e.g., a plasma etching process) that includes selective removal of wafer material not covered by resist.

The process 900 represents a typical process to which embodiments of the invention can be applied. Referring also to FIGS. 1-3 and 13, starting at 910, a wafer is provided in a processing system, for example the coating/developing processing system 1 depicted in FIGS. 1-3.

In 920, a resist is applied to the wafer. For example, the resist material can be applied by dispensing a liquid containing the resist material onto the wafer while the wafer is mounted on a spin chuck (not shown) with a cup (not shown). For example, the resist can be a chemically amplified resist (CAR). A CAR can be characterized by an acid component, a quenched component, and an inhibitor quencher. In one example, an adhesion layer or a surfactant layer can be provided on the wafer surface before the resist material is applied.

CARs were developed to enhance the exposure process because of the low spectral energy of deep ultraviolet (DUV) radiation. A CAR contains one or more components that are insoluble in a developer solution. These components can comprise chemical protectors. A CAR can also contain a photoacid generator (PAG). During a radiation exposure step, the PAGs produce acid molecules for the patterning process. Desirably, the acid molecules remain inactive until a post exposure bake (PEB) is performed. The PEB drives a de-protection reaction forward in which the thermal energy causes the acid to react with the chemical protectors.

In 930, a post application bake (PAB) can be performed in the coating/developing processing system 1 to cure the applied resist. In an alternate embodiment, a curing step is not required. In addition, a cooling step can be performed after the PAB. In a PAB heating unit, the resist can be heated to temperatures at least higher than room temperature, and in a cooling unit, the resist, can be cooled to temperatures at or below room temperature.

In 940, the resist is patterned in a lithography tool 23A using light radiation or charged particles such as electrons. The desired pattern can, for example, be created on the resist using beams of high-energy electrons or arrays of laser beams and a mask that defines the size and shape of the pattern. For example, deep ultraviolet (DUV) can be used. DUV lithography is a key enabling technology that can be used to manufacture semiconductor devices with features of 0.25 microns (micron=$10^{-6}$ m) or less.

In other cases, extreme ultraviolet (EUV) sources can be used for critical dimensions below 0.05 microns. EUV lithography utilizes light with wavelengths in a range of about 5 nm to 50 nm, with about 13 nm being the most common.

In 940, the resist pattern is exposed to the light radiation or charged particles for a predetermined time period to achieve a desired exposure dose. Exposure dose refers to the amount of energy (per unit area) that the resist is subjected to upon exposure by the lithography tool 23A. For optical lithography, exposure dose is equal to the light intensity times the exposure time. In resist patterning, resolution is the smallest feature that can be printed (e.g., for a given process and processing system) with sufficient quality. It is common to use focus and exposure dose as process variables, so that resolution is defined as the smallest feature of a given type that can be printed with a specified depth of focus. The depth of focus of a feature is often defined as the range of focus that keeps the resist profile of a given feature within all specifications (e.g., linewidth, sidewall angle, resist loss) over a specified exposure range.

The lithography tool 23A can contain a controller (not shown) to control the exposure dose and focus across a wafer to be patterned. The controller may receive instructions from the CD optimizer system 1300 to adjust the exposure dose and focus based on CD metrology data received from the patterned wafers. Adjusting the exposure dose and focus of the lithography tool 23A establishes adjusted exposure dose and focus settings across the wafer for patterning additional resist coated manufacturing wafers.

In 950, a PEB process can be performed in the coating/developing processing system 1 to drive the de-protection reaction forward. The de-protection reaction is acid driven and takes place in the areas exposed to the radiation or to the charged particles. In addition, a cooling step can be performed after the PEB. In a PEB process, the resist can be heated to temperatures at least higher than room temperature, and in a cooling unit, the resist can be cooled to temperatures at or below room temperature.

The PEB process plays an important role in the process 900. Heat-treating a resist can have many purposes that range from removing a solvent from the resist material to catalyzing the chemical amplification. In addition to the intended results, heat-treating can cause numerous problems. For example, the light or charged particle sensitive component of the resist may decompose at temperatures typically used to remove the solvent, which is an extremely serious concern for a chemically amplified resist since the remaining solvent content has a strong impact on the diffusion and amplification rates. In addition, heat-treating can affect the dissolution properties of the resist and thus have direct influence on the developed resist profile. Many resists are particularly sensitive to temperature variations during a heat-treatment, such as PEB, and temperature variations can result in variations in CDs across a wafer surface and between different hotplates.

In 960, the resist is developed in the coating/developing processing system 1 by selectively dissolving exposed areas of the resist. For example, a developing solution, such as a 2.3 wt % solution of tetramethyl ammonium hydroxide (TMAH), can be used. In addition, rinsing steps can also be performed. For example, a developing solution and/or a rinsing solution can be applied by mounting the wafer on a spin chuck (not shown) within a cup (not shown).

In 970, a post development bake (PDB) can be performed in the coating/developing processing system 1 to harden the resist pattern in preparation for subsequent pattern transfer into the underlying wafer or wafer layers. For example, the post development bake can improve the etch resistance of the patterned resist during plasma etching of the underlying wafer.

Following formation of a patterned resist, a CD of the patterned resist may be inspected by the light scattering system 23B at a plurality of test areas on the wafer to determine if it has been correctly manufactured. CD commonly refers to a size (width) of a feature formed in the resist. Key requirements for the processing of wafers are tight CD control, tight profile control, and tight uniformity control—both within-wafer and wafer-to-wafer. For example, variations in CD measurements, profile measurements, and uniformity measurements are commonly caused by variations in temperature profile across a wafer, variations in thermal response from wafer to wafer, and variations in temperature profiles between hotplates.

The CD metrology data that is obtained contains important information on the CD and the CD uniformity of the patterned resist at the inspected test areas across the wafer. The CD metrology data obtained by the inspection process may be utilized to reduce CD variations due to variations in temperature-related variations during a heat-treating step such as the PEB step, PAB step, or the PDB step.

The CD metrology data from light scattering system 23B may be relayed to the CD optimizer system 1300. In addition to the adjusted exposure dose and focus settings described above, the CD optimizer system 1300 can provide for adjusted temperature profiles for wafers to be heat-treated on hotplates in the coating/developing processing system 1, in order to reduce CD variations in the subsequently heat-treated wafers. The CD optimizer can utilize a thermal model for real time correction to adjust the temperature profile of the hotplate surfaces to improve CD uniformity due to variations in temperature profiles across hotplate surfaces and between different hotplates. The heat-treating can be performed using hotplates having multiple temperature control zones (hotplate segments), and feedback and feed-forward controllers to manipulate the hotplate temperature fields and the temperature profiles across the hotplates.

Figure 10:
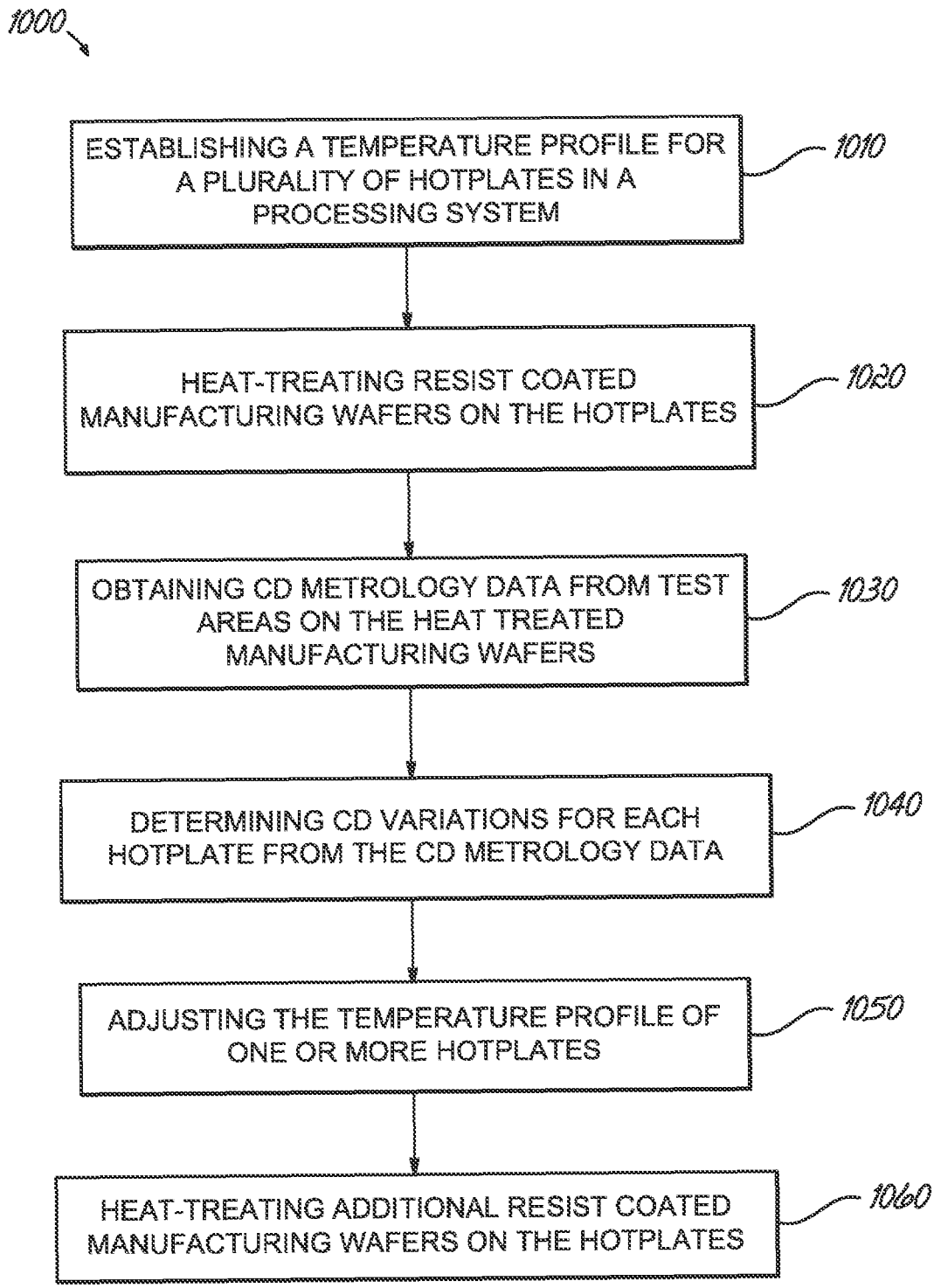
FIG. 10 is a simplified process flow diagram of a method for in-line monitoring and controlling in heat-treating of resist coated manufacturing wafers in accordance with an embodiment of the invention.

FIG. 10 is a simplified process flow diagram of a method for in-line monitoring and controlling in heat-treating of resist coated manufacturing wafers in accordance with an embodiment of the invention. The process flow 1000 includes, in 1010, establishing a temperature profile for a plurality of hotplates in a processing system. Each hotplate surface can be divided into a plurality of temperature control zones and substantially equal temperatures can be established for all of the temperature control zones on each hotplate. Alternately, different temperatures can be established for one or more of the temperature control zones on each hotplate. According to an embodiment of the invention, establishing hotplate temperatures for the hotplates can include establishing a first temperature profile for each hotplate using a known temperature for each temperature control zone on each hotplate. For example, the first temperature profile can be selected and established based on historical data for this type of wafer and resist.

In one embodiment, one or more heater elements are located within each temperature control zone. Alternately, cooling elements can be provided. In addition, one or more temperature sensors can be located within each temperature control zone. Alternately, optical techniques can be used to measure temperature.

In 1020, resist coated manufacturing wafers are heat-treated on the hotplates, e.g., a predetermined number of resist coated manufacturing wafers may be heat-treated in parallel on each hotplate. The heat-treating can, for example, include a PAB process, a PEB process, or a PDB process.

In 1030, CD metrology data is obtained from test areas on the heat-treated resist coated manufacturing wafers. In one example, CD metrology data may be obtained for all the heat-treated wafers. Alternately, CD metrology data may be obtained for fewer than all the heat-treated wafers. According to one embodiment of the invention, the CD metrology data may be obtained by the light scattering system 23B. The CD metrology data can include average CD data and within-wafer CD uniformity data for wafers heat-treated on the same hotplate.

In 1040, CD variations for each hotplate are determined from the CD metrology data. The CD variations can be determined by comparing the CD metrology data for each hotplate to a desired CD metrology value or range. For example, average CD for each hotplate can be compared to a desired CD value or range. In another example, within-wafer CD uniformity for each hotplate can be compared to a desired within-wafer uniformity value or range.

In 1050, the temperature profile of one or more hotplates is adjusted after determining the CD variations. According to an embodiment of the invention, adjusting the temperature profile can include establishing an adjusted known temperature for each temperature control zone for the one or more hotplates. In one example, the temperature profile of less than all the hotplates may be adjusted, but this is not required for embodiments of the inventions as the temperature profile of all the hotplates may be adjusted.

According to one embodiment, the CD metrology data and/or the CD variations for each hotplate may be forwarded to the CD optimizer system 1300 and the temperature control zones and temperature profiles adjusted based on an output of the CD optimizer system 1300. The CD optimizer system 1300 can utilize a thermal model for real time correction to adjust the temperature control zones and temperature profile of the hotplate surfaces to improve average CD between different hotplates and within-wafer CD uniformity due to variations in hotplate temperatures and variations in temperature profiles across hotplate surfaces. The CD optimizer system 1300 is configured to adjust the temperature profile using power controllers and temperature sensors that manipulate the hotplate temperature field and the temperature profile across the hotplate surface.

In 1060, when an adjusted hotplate temperature has been established for one or more hotplates, additional resist coated manufacturing wafers may be heat-treated in parallel on the hotplates. According to one embodiment of the invention, the temperature profile across a hotplate surface may be adjusted between each wafer to be heat-treated on a hotplate. Alternately, the temperature profile across a hotplate surface may be adjusted between a predetermined number of wafers to be heat-treated on the hotplates.

Figure 11A:
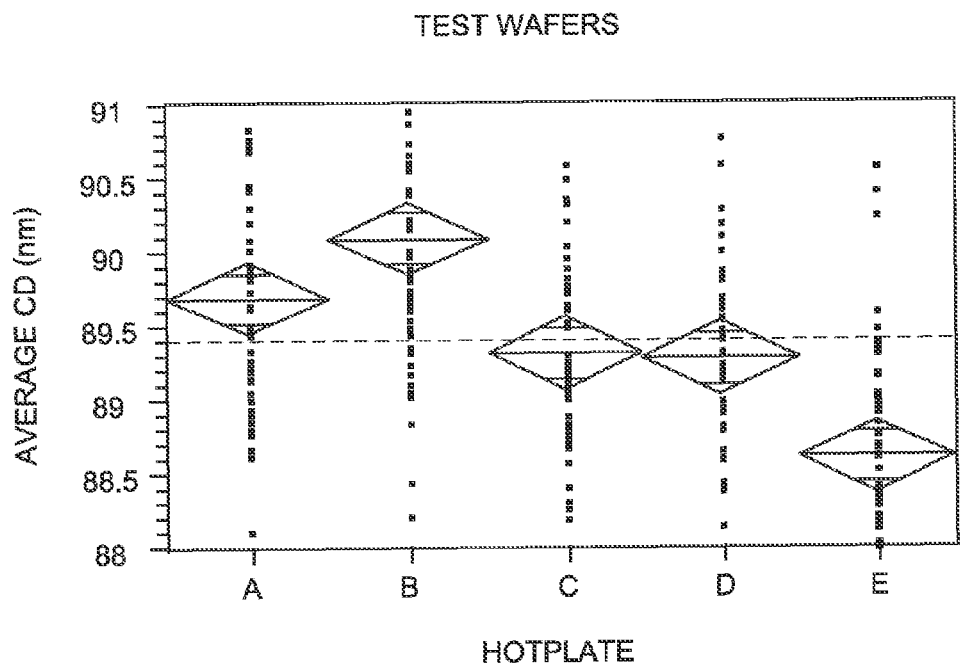
FIGS. 11A and 11B show average CD for resist coated test wafers and resist coated manufacturing wafers heat-treated on different hotplates.
Figure 11B:
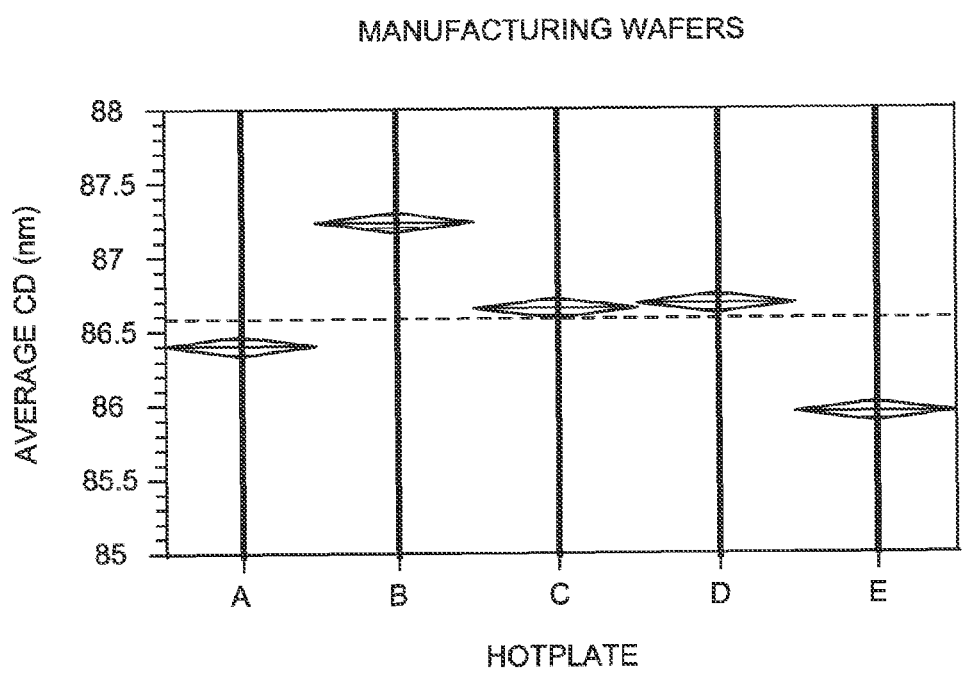

FIGS. 11A and 11B show average CD for resist coated test wafers and resist coated manufacturing wafers heat-treated on different hotplates. The average CD is shown for five hotplates used for PEB processing, where the five hotplates are designated A-E. The number of CD test areas on each test wafer was 25 and the number of test areas on each manufacturing wafer was 7. The average CD for the test areas on each test wafer and on each manufacturing wafer was calculated and those results used to further calculate the average CD for each hotplate presented in FIGS. 11A and 11B. The average CD and 95% confidence intervals for each hotplate are shown using diamond symbols. FIGS. 11A and 11B show similar distributions of the average CDs for the test wafers and the manufacturing wafers on the five hotplates. For example, the average CD for hotplate B is the largest in the group of the five hotplates, the average CD for hotplate E is the smallest in the group, and the average CD for each of hotplates A, C, and D is close to the group averages (horizontal dotted lines) in both FIGS. 11A and 11B. Comparison of FIGS. 11A and FIG. 11B further shows that the 95% confidence intervals for each hotplate are smaller for the manufacturing wafers. This is due to the larger number of manufacturing wafers tested compared to the test wafers, although the number of test areas on each test wafer is larger than the number of test areas on each manufacturing wafer. For example, the average CD for resist coated test wafers heat-treated on hotplate A was 89.70 at a confidence interval of 0.25 nm. In comparison, the average CD for resist coated manufacturing wafers heat-treated on hotplate A was 86.40 at a confidence interval of 0.05 nm.

FIG. 11A shows that the use of resist coated test wafers cannot be used to detect and correct average CD variations below about 1 nm between different hotplates. However, FIG. 11B shows that using resist coated manufacturing wafers as described in embodiments of the invention can be used to detect and correct average CD variations of about 0.2 nm, or lower. Differences in average CD of about 0.2 nm or lower are likely required for technology nodes below 70 nm, for example 64 nm and 32 nm nodes. In FIGS. 11A and 11B, the dotted horizontal lines show the cumulative average CD for the five hotplates. The cumulative average is about 89.4 nm for the test wafers in FIG. 11A and about 86.6 nm for the manufacturing wafers in FIG. 11B. The difference in the cumulative average CDs between the test wafers and the manufacturing wafers is due to one or more factors that include different light exposure doses during patterning, use of different masks during patterning, and different wafer reflectivity. Thus, the difference in cumulative average CDs between the test wafer and the manufacturing wafers is due to factors other than PEB processing conditions.

Still referring to FIGS. 11A and 11B, average CD variations between resist coated wafers heat treated on different hotplates may be reduced and corrected by adjusting the temperature of one or more hotplates. For example, for certain resists, an average CD for a resist coated wafer treated on a hotplate may be lowered (raised) by raising (lowering) the hotplate temperature. For example, in FIG. 11B, the average CD for hotplate E may be raised by lowering the temperature of the hotplate, and the average CD for hotplate B may be lowered by raising the temperature of the hotplate.

Figure 12A:
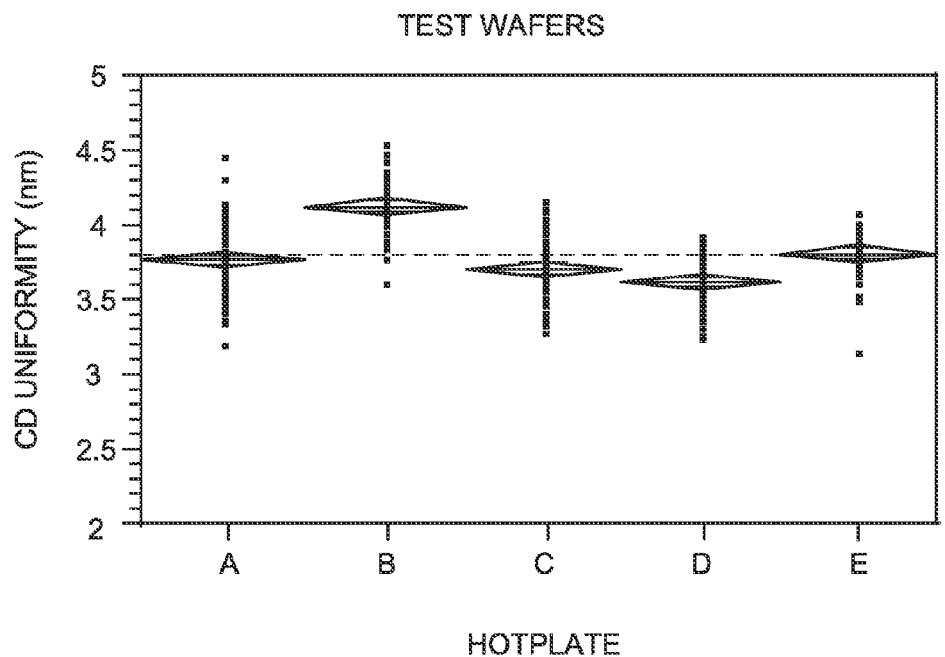
FIGS. 12A and 12B show within-wafer CD uniformity for resist coated test wafers and resist coated manufacturing wafers heat-treated on different hotplates.
Figure 12B:
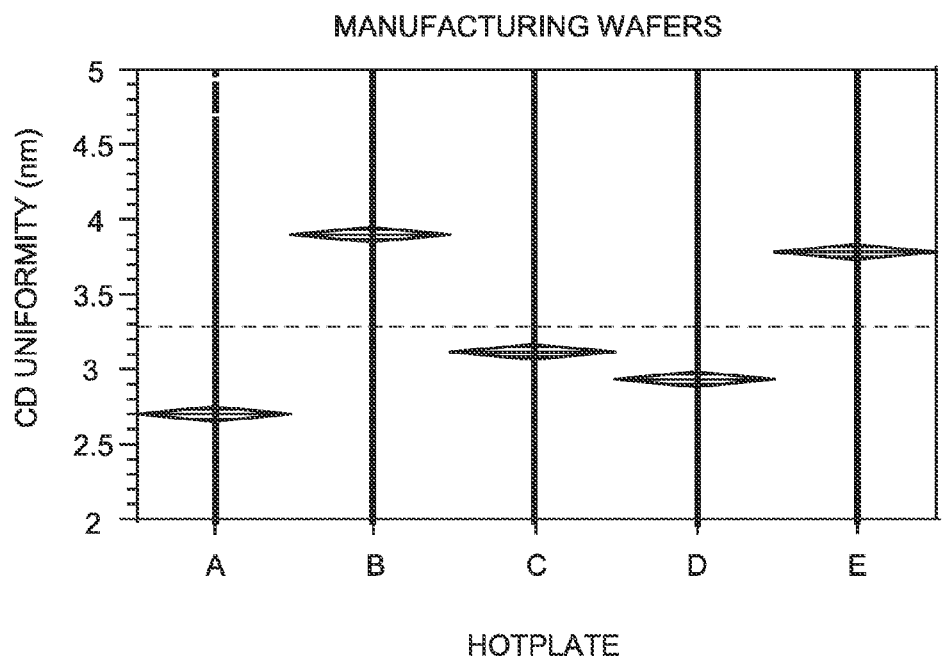

FIGS. 12A and 12B show within-wafer CD uniformity for resist coated test wafers and resist coated manufacturing wafers heat-treated on different hotplates. FIGS. 12A and 12B show that there is a significant difference in the within-wafer CD uniformity between the five hotplates. However, FIGS. 12A and 12B show similar qualitative distributions for the test wafers and the manufacturing wafers on the five hotplates. As those skilled in the art will readily recognize, the difference in CD uniformity between the five hotplates in FIG. 12B may be reduce by using a larger number of test areas on each manufacturing wafer.

According to one embodiment of the invention, the CD metrology data for each hotplate can be compared to a CD metrology fault value, and if the fault value is exceeded, a corrective action can be taken. For example, a CD metrology fault value can be an average CD value or within-wafer CD uniformity value that differs greatly from a desired value. Fault values may be based on historical data for a hotplate or determined by design of experiments (DOE). Faults that may require a corrective action to be taken can include a faulty heater or thermocouple in one or more temperature control zones on a hotplate. According to embodiments of the invention, average CD and CD uniformity can be used for such fault detection. In one example, a hotplate fault can be monitored and detected by comparing a calculated average CD to an average CD fault value. In another example, a hotplate fault may be monitored and detected by comparing calculated within-wafer CD uniformity to a within-wafer CD uniformity fault value.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative system and methods, and illustrative examples shown and described. Accordingly, departures may be made from such details without departing from the scope of applicants' general inventive concept.

What is claimed is:

1. A method of heat-treating resist coated manufacturing wafers in a processing system, the method comprising:
   establishing a temperature profile for each of a plurality of hotplates in the processing system;
   heat-treating the resist coated manufacturing wafers in parallel on the plurality of hotplates;
   obtaining CD metrology data from test areas on the heat-treated resist coated manufacturing wafers;
   determining CD variations for each of the plurality of hotplates from the CD metrology data;
   adjusting the temperature profile of one or more of the plurality of hotplates after determining the CD variations; and
   heat-treating additional resist coated manufacturing wafers in parallel on the plurality of hotplates after the adjusting,
   wherein the determining comprises comparing the CD metrology data for each of the plurality of hotplates to a CD metrology fault value, and the adjusting comprises adjusting the temperature profile of the one or more hotplates that exceed the CD metrology fault value.

2. The method of claim 1, wherein each of the plurality of hotplates is divided into a plurality of temperature control zones.

3. The method of claim 2, wherein the establishing a temperature profile comprises:
   establishing a known temperature for each of the plurality of temperature control zones on each of the plurality of hotplates.

4. The method of claim 3, wherein the adjusting comprises
   establishing an adjusted known temperature for each temperature control zone on the one or more hotplates to establish an adjusted temperature profile for the one or more hotplates.

5. The method of claim 1, wherein the heat-treating comprises a post application bake (PAB), a post exposure bake (PEB), or a post development bake (PDB).

6. The method of claim 1, wherein the determining comprises
   forwarding the CD metrology data to a CD optimizer system to determine CD variations for each of the plurality of hotplates and the adjusting comprises adjusting the temperature profile of one or more hotplates using the output of the CD optimizer system.

7. The method of claim 1, wherein the obtaining comprises obtaining CD metrology data using a light scattering technique.

8. The method of claim 1, wherein the CD variations comprise average CD data or within-wafer CD uniformity data, or both.

9. The method of claim 1, wherein the determining comprises comparing the CD metrology data for each of the plurality of hotplates to a desired CD metrology value or range, and the adjusting comprises adjusting the temperature profile of the one or more hotplates that deviate from the desired CD metrology value or range.

10. The method of claim 1, wherein the determining comprises comparing an average CD for each of the plurality of hotplates to a desired CD value or range, and the adjusting comprises adjusting the temperature profile of the one or more hotplates that deviate from the desired CD value or range.

11. The method of claim 1, wherein the determining comprises comparing a within-wafer CD uniformity for each of the plurality of hotplates to a desired within-wafer CD uniformity value or range, and the adjusting comprises adjusting the temperature profile of the one or more hotplates that deviate from the desired within-wafer CD uniformity value or range.

12. A method of heat-treating resist coated manufacturing wafers in a processing system, the method comprising:
   establishing a temperature profile for each of a plurality of hotplates in the processing system, wherein each hotplate is divided into a plurality of temperature control zones;
   heat-treating the resist coated manufacturing wafers in parallel on the plurality of hotplates in a PEB process;
   obtaining CD metrology data from test areas on the heat-treated resist coated manufacturing wafers using a light scattering technique;

determining CD variations for each of the plurality of hotplates from the CD metrology data by comparing the CD metrology data to a desired CD metrology value or range;

adjusting the temperature profile of each hotplate that deviates from the desired CD metrology value or range to reduce the CD variations; and heat-treating additional resist coated manufacturing wafers in parallel on the hotplates after the adjusting;

wherein the determining comprises comparing the CD metrology data for each of the plurality of hotplates to a CD metrology fault value, and the adjusting comprises adjusting the temperature profile of each hotplate that exceeds the CD metrology fault value.

13. The method of claim 12, wherein the determining comprises:

forwarding the CD data to a CD optimizer system to determine CD variations for each of the plurality of hotplates and the adjusting comprises adjusting the temperature profile using the output of the CD optimizer system.

14. The method of claim 12, wherein the adjusting comprises establishing an adjusted known temperature for each temperature control zone on each hotplate that deviates to establish an adjusted temperature profile for each hotplate that deviates.

15. The method of claim 12, wherein the CD metrology data comprises average CD data, within-wafer CD uniformity data, or both.

16. The method of claim 12, wherein the determining comprises comparing an average CD for each of the plurality of hotplates to a desired CD value or range, and the adjusting comprises adjusting the temperature profile of each hotplate that deviates from the desired CD value or range.

17. The method of claim 12, wherein the determining comprises comparing within-wafer CD uniformity for each of the plurality of hotplates to a desired within-wafer CD uniformity value or range, and the adjusting comprises adjusting the temperature profile of each hotplate that deviates from the desired within-wafer CD uniformity value or range.

* * * * *